(12) United States Patent
Dzioba

(10) Patent No.: US 7,851,719 B2
(45) Date of Patent: Dec. 14, 2010

(54) SEAT CONTROL SYSTEM

(75) Inventor: David A. Dzioba, Frankenmuth, MI (US)

(73) Assignee: TouchSensor Technologies, Inc., Wheaton, IL (US)

( * ) Notice: Subject to any disclaimer, the term of this patent is extended or adjusted under 35 U.S.C. 154(b) by 93 days.

(21) Appl. No.: 11/315,717

(22) Filed: Dec. 22, 2005

(65) Prior Publication Data

US 2006/0185968 A1    Aug. 24, 2006

Related U.S. Application Data

(60) Provisional application No. 60/638,198, filed on Dec. 23, 2004, provisional application No. 60/638,197, filed on Dec. 23, 2004, provisional application No. 60/638,159, filed on Dec. 23, 2004.

(51) Int. Cl.
    *H03K 17/975*    (2006.01)
(52) U.S. Cl. ...................... 200/600; 200/512; 200/85 A
(58) Field of Classification Search ............... 200/4, 200/600
    See application file for complete search history.

(56) References Cited

U.S. PATENT DOCUMENTS

| | | | |
|---|---|---|---|
| 4,125,783 A | | 11/1978 | Sefton |
| 4,290,052 A | | 9/1981 | Eichelberger et al. |
| 4,290,061 A | | 9/1981 | Serrano |
| 4,380,040 A | | 4/1983 | Posset |
| 5,467,080 A | | 11/1995 | Stoll et al. |
| 5,594,222 A | | 1/1997 | Caldwell |
| 5,668,357 A | * | 9/1997 | Takiguchi et al. ........... 200/5 R |
| 5,844,486 A | | 12/1998 | Kithil et al. |
| 5,864,105 A | * | 1/1999 | Andrews ................... 200/5 R |
| 5,866,862 A | * | 2/1999 | Riffil et al. .................. 200/5 R |
| 5,922,630 A | * | 7/1999 | Wu et al. ..................... 502/64 |
| 6,040,533 A | | 3/2000 | Wagner |
| 6,320,282 B1 | | 11/2001 | Caldwell |
| 6,452,514 B1 | | 9/2002 | Philipp |

(Continued)

FOREIGN PATENT DOCUMENTS

DE    19806479    7/1999

(Continued)

OTHER PUBLICATIONS

PCT Search Report Dated May 3, 2006.

(Continued)

*Primary Examiner*—Renee Luebke
*Assistant Examiner*—Lheirne Mae A Caroc
(74) *Attorney, Agent, or Firm*—Barnes & Thornburg LLP

(57) ABSTRACT

The present invention relates to a seat control system for a vehicle. The system includes a substrate with a plurality of touch zones disposed on one surface of the substrate, and a plurality of electrode patterns disposed on the opposite surface. An inner electrode of each pattern is aligned with one of the touch zones. Each pattern is electrically coupled to an active electrical component, which energizes the electrodes of the pattern such that electric fields emanate therefrom. The pattern may be capacitively coupled to the component. When the electric field of the inner electrode is disturbed by a stimulus proximate the corresponding touch zone, the component is activated. Upon activation of one of the components, a controller causes the seat to move in a desired direction.

20 Claims, 3 Drawing Sheets

U.S. PATENT DOCUMENTS

| | | | |
|---|---|---|---|
| 6,617,975 B1 | 9/2003 | Burgess | |
| 6,774,505 B1 * | 8/2004 | Wnuk | 307/10.8 |
| 6,822,640 B2 | 11/2004 | Derocher | |
| 6,958,459 B2 * | 10/2005 | Engelmann | 200/600 |
| 7,361,860 B2 | 4/2008 | Caldwell | |
| 7,390,982 B2 * | 6/2008 | Schmidt et al. | 200/5 R |
| 2004/0124714 A1 | 7/2004 | Caldwell | |

FOREIGN PATENT DOCUMENTS

| | | |
|---|---|---|
| DE | 19931766 | 1/2001 |
| EP | 1031457 | 8/2000 |
| EP | 1487105 | 12/2004 |
| FR | 2779889 | 12/1999 |
| GB | 2156992 | 10/1985 |
| WO | WO 03/049968 | 6/2003 |

OTHER PUBLICATIONS

IPRP issued Mar. 30, 2010, in related Application No. PCT/US05/46682 (2010).

Int'l Search Report & Written Opinion issued Sep. 6, 2006, in Application No. PCT/US05/46667 (2006).

Office Action issued May 21. 2008, in related Application No. EP05855268.8 (2008).

Office Action issued Dec. 23, 2009, in related Application No. EP05855268.8 (2009).

Office Action issued Jun. 5, 2009, in related Application No. NZ 556024 (2009).

* cited by examiner

SEAT CONTROL SYSTEM

CROSS REFERENCE TO RELATED APPLICATIONS

This application claims priority from and incorporates by reference the disclosure of U.S. Provisional Patent Application No. 60/638,198, filed Dec. 23, 2004. This application also claims priority from and incorporates by reference the disclosures of U.S. Provisional Patent Application No. 60/638,197, entitled Track Position Sensor and Method, and U.S. Provisional Patent Application No. 60/638,159, entitled Keyless Entry Touch Pad System and Method, both filed Dec. 23, 2004, and U.S. patent application Ser. No. 11/315,719, entitled Track Position Sensor and Method, and U.S. patent application Ser. No. 11/315,820, entitled Keyless Entry Touch Pad System and Method, both filed Dec. 22, 2005.

FIELD OF THE INVENTION

The present invention relates generally to a power seat control system and more particularly to a user interface for such a system.

BACKGROUND OF THE INVENTION

Power seat control systems electrically adjust seats forwards and backwards and up and down to suit the user. Many vehicles include a set of mechanical switches, which are hard-wired to a control module, for controlling movement of the seat. These switches are typically mounted on the side of the seat or the door panel arm rest. As such, the seat or door panel typically includes an opening for receiving the switches. In addition, the switches themselves typically include openings. These openings allow dirt, water and other contaminants to enter the switches, potentially causing electrical shorts and other malfunctions.

SUMMARY OF THE INVENTION

The present invention is directed to an ergonomic seat control system and panel. The panel preferably includes a base portion having one or more protruding portions that preferably mimic the profile of a seat. Preferably, the protruding portions are integrally molded with the base portion. Touch sensors, preferably field effect sensors, are associated with each of the protruding portions. The sensors are coupled to a controller that provides control signals to, for example, motors which cause movement of the seat in a desired direction upon actuation of a corresponding sensor. The panel may include additional sensors in its base portion or elsewhere for controlling other functions. The use of sensors allows for a thin component profile, as compared to conventional apparatus using, for example, mechanical switches. A thin profile the control system to be implemented in a relatively small space.

The panel may be molded from a separate piece of plastic or other dielectric material, and installed on a piece of trim, on a side of the seat, or on the door panel arm rest. Alternatively, the panel, its protruding portions, and electrodes of the field effect sensors may be integrally molded as one with the trim piece. In still other embodiments, the panel can be incorporated into or under the seat fabric, such that sensing can be accomplished, for example, through the seat fabric.

DETAILED DESCRIPTION OF THE ILLUSTRATED EMBODIMENTS

Figure 1:
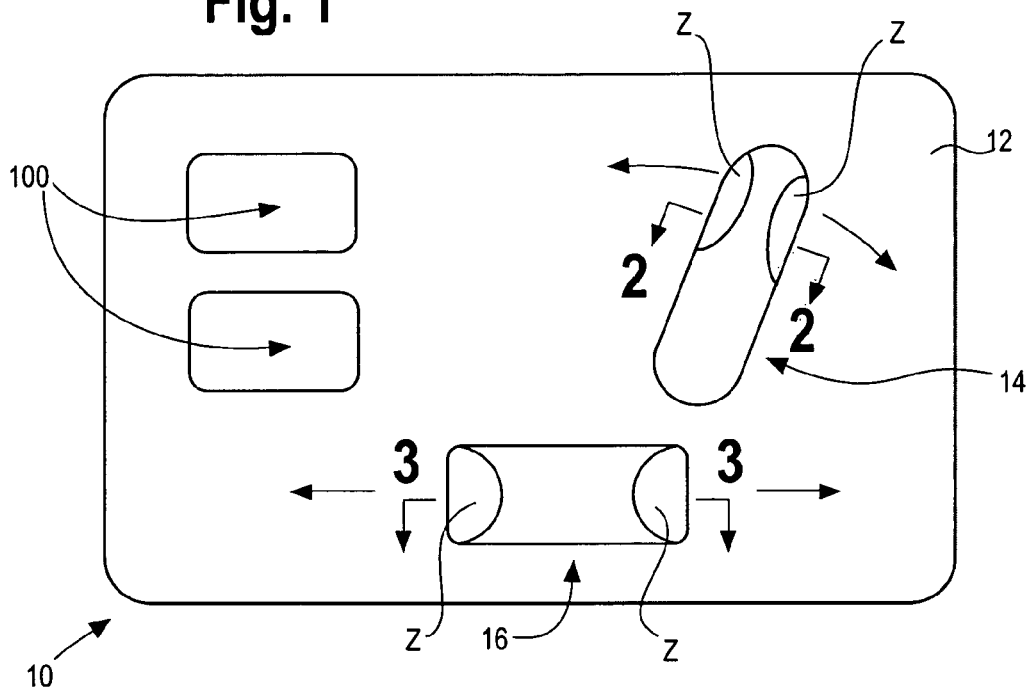
FIG. 1 is a plan view of a seat control panel according to an embodiment of the present invention.

FIG. 1 illustrates the layout of a seat control system panel 10 according to a first embodiment of the invention. Panel 10 preferably is formed from a dielectric substrate, such as plastic, fiberglass reinforced epoxy resin, or some other dielectric substance. Panel 10 may be a separate molded panel, which in turn is secured to a seat or arm rest in the door panel of a vehicle. Alternatively, panel 10 may be integral to and formed in connection with the forming of the seat or arm rest. Panel 10 may be located elsewhere in other embodiments.

Figure 2:
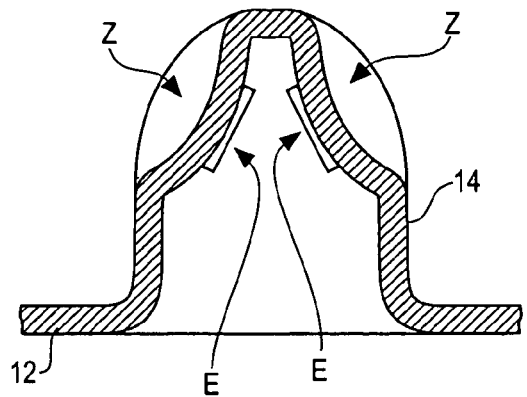
FIG. 2 is a cross-sectional view of a first molded portion of the panel shown in FIG. 1 taken along line 2-2.
Figure 3:
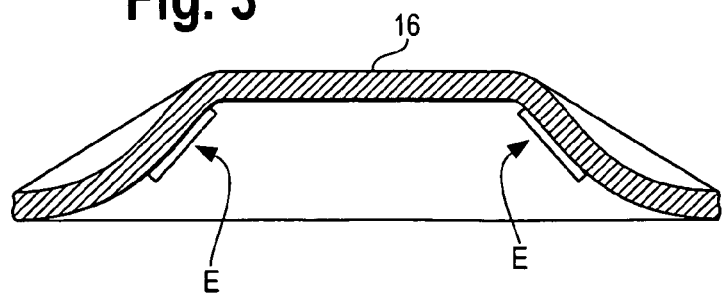
FIG. 3 is a cross-sectional view of a second molded portion of the panel shown in FIG. 1 taken along line 3-3.

As best shown in FIGS. 1-3, panel 10 includes base portion 12. First and second protruding portions 14, 16 extend outwardly from base portion 12. Preferably, protruding portions 14, 16 are molded integrally with panel 10. Electrode patterns E preferably are disposed on each of protruding portions 14, 16. Each protruding portion 14, 16 preferably includes two electrode patterns E disposed at opposite ends or sides thereof. Additional electrode patterns can be disposed on or otherwise associated with base portion 12, as depicted by sensor locations 100 in FIG. 1.

Figure 4:
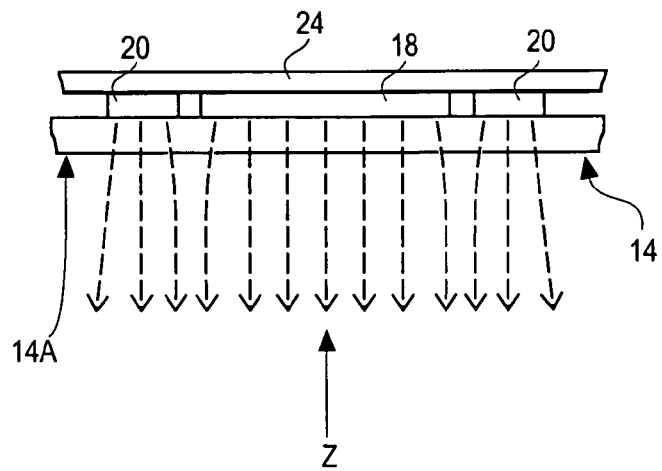
FIG. 4 is a cross-sectional fragmentary view of a touch zone, with broken lines illustrating electric flux lines.
Figure 5:
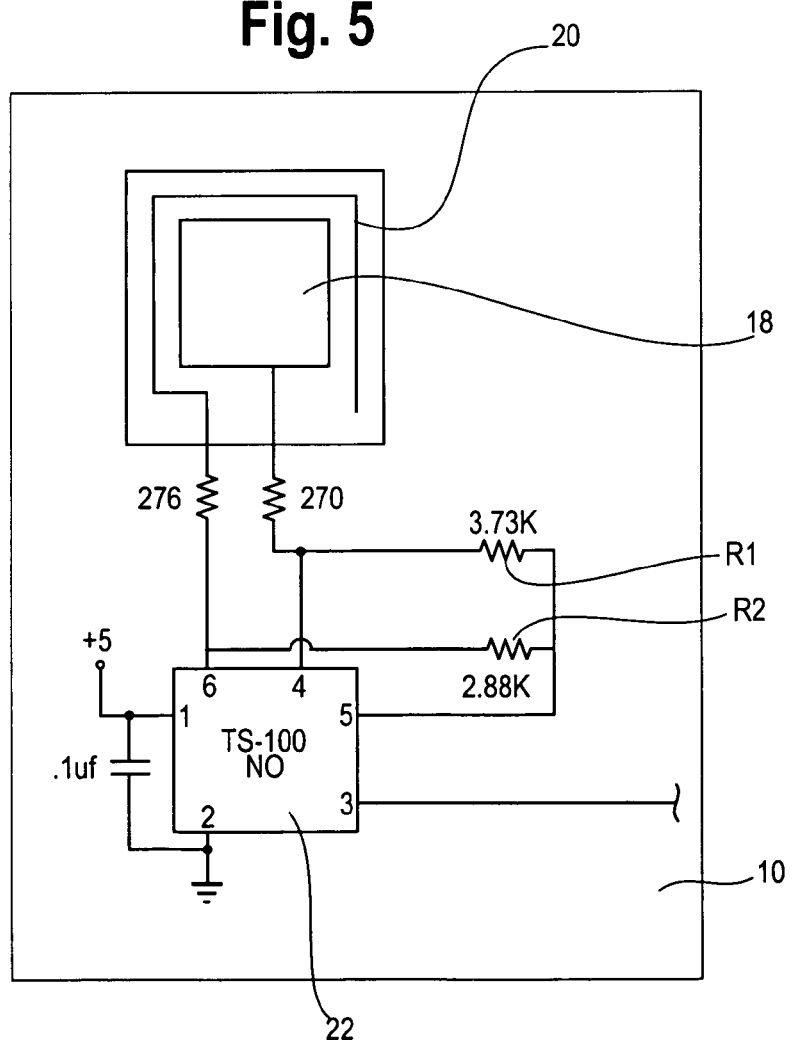
FIG. 5 is a plan view of a schematic diagram illustrating the electrical connections of an electrode pattern and associated integrated circuit including pulse generation and detection circuitry.

As best shown in FIGS. 4 and 5, each electrode pattern E preferably has an inner electrode 18 and an outer electrode 20. Inner and outer electrodes 18, 20 of each electrode pattern E are electrically coupled to a pulse generation circuit and a detection circuit, preferably through resistors R1 and R2. In preferred embodiments, the pulse generation and detection circuits are embodied on an integrated control circuit 22, as best shown in FIG. 5. In certain embodiments, resistors R1, R2 can be provided internally within integrated control circuit 22. In the illustrated embodiments, resistors R1, R2 are external to integrated control circuit 22. Inner and outer electrodes 18, 20 may be connected to the associated integrated control circuit 22 via lead or trace wires, or capacitively coupled thereto, as described in U.S. Provisional Patent Application No. 60/638,159. Preferably, a quick set potting material overlays and seals the foregoing components.

In alternate embodiments, electrode patterns E and corresponding integrated control circuits 22 can be disposed on a separate substrate, such as a printed circuit board or flexible circuit carrier, which is attached to panel 10 by any suitable means. In further alternate embodiments, electrode patterns E can be disposed on panel 10 and corresponding integrated control circuits 22 can be disposed on a separate substrate.

Integrated control circuit 22 preferably is a TS-100 ASIC, an integrated circuit available from TouchSensor Technologies, LLC of Wheaton, Ill. The general principles of operation of the TS-100 ASIC are described in U.S. Pat. No. 6,320,282 to Caldwell, the disclosure of which is incorporated herein by reference. The pin-out of integrated circuit 26 as shown in the drawings corresponds to that of the TS-100 ASIC, where the input power (+5 volts) connection is on pin 1, the ground connection is on pin 2, the signal output connection is on pin 3, the outer electrode 24 connection is on pin 4, the excitation signal connection is on pin 5, and the inner electrode 22 connection is on pin 6.

A corresponding touch zone Z is associated with each electrode pattern E. Preferably, each touch zone Z is coaxially aligned with inner electrode 18 from the respective electrode pattern E and associated with a surface of panel 10 opposite the surface on which the corresponding electrode pattern E is disposed. FIG. 2 illustrates one such arrangement where touch zones Z corresponding to electrode patterns E are disposed on protruding portion 14.

Figure 6:
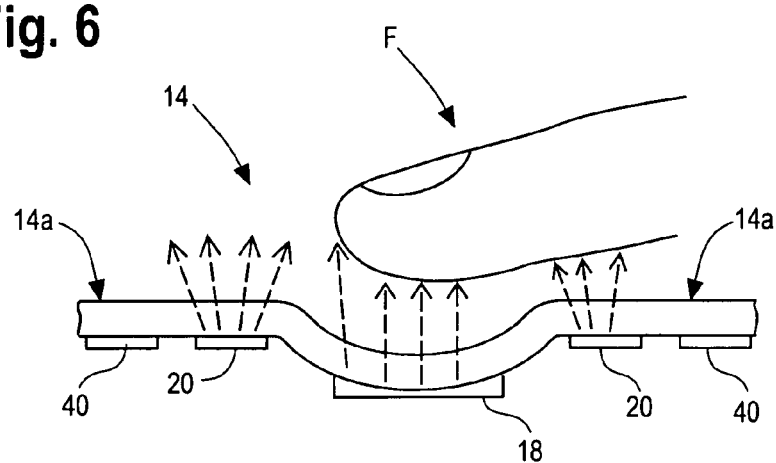
FIG. 6 is a cross-sectional fragmentary view of a touch zone with a user's finger proximate an inner electrode.

Preferably, the touch zones associated with protruding portions 14, 16 include depressions for receiving the finger tip of a user, as best shown in FIG. 6. Preferably, such depressions are located and sized to receive a finger F of a user in substantially alignment with the corresponding inner electrode 18. Other tactile means, such as bumps and bezels, can be used to help a user locate touch zones Z.

Preferably, protruding portions 14, 16 and associated touch zones Z correspond ergonomically to particular seat functions. For example, as best illustrated in FIG. 1, protruding portion 16 preferably corresponds to a seat bottom and the touch zones thereon correspond to forward and backward movement of the seat. Preferably, a touch on the forward touch zone Z, mimicking a rearward force on the seat bottom, would cause the seat to move rearward, and a touch on the rearward touch zone A, mimicking a forward force on the seat bottom, would cause the seat to move forward. Similarly, protruding portion 14 preferably corresponds to a seat back and the touch zones thereon correspond to forward and backward inclination of the seat back.

In operation, electrical signals are provided to inner and outer electrodes 18, 20 via the excitation signal from pin 5. Preferably, an oscillator output pulse train or square wave signal is provided at pin 5 to both inner electrode 18 and outer electrode 20. The oscillator signal may be a square wave oscillating between 0 and +5 volts at a frequency of approximately 32 kHz. Alternatively, the oscillator or strobe signal may have a frequency of up to or greater than 200 kHz, depending on the detection circuitry used. Furthermore, the strobe signal may oscillate between 0 and +3 volts, 0 and +12 volts, 0 and +24 volts, −5 volts and +5 volts, or any other voltage range.

The electrical signals applied to inner and outer electrodes 18, 20 of each electrode pattern E generate electric fields about electrodes 18, 20. As best shown by dashed lines in FIGS. 4 and 6, electric flux lines emanate from inner and outer electrodes 18, 20 and through panel 10, such that electric fields corresponding to each inner and outer electrode 18, 20 emanate from touch zones Z. Although not shown in the drawings, electric flux lines would also emanate from inner and outer electrodes 18, 20 in the opposite direction, away from (rather than through) panel 10. However, the electric flux concentration would be greater near the touch zones Z on the user accessible surface of panel 10, given that the electric flux concentration is multiplied through dielectric substrates, as would be understood by one skilled in the art. An insulator, such as a potting material, preferably is applied to the electrode pattern side of panel 10 to shield or dissipate the electric fields emanating away from panel 10. In other embodiments, an air gap or backing of foam rubber or plastic may be provided. Alternatively, a floating shield 40 may be provided around outer electrode 20, as shown in FIG. 6.

Preferably, inner and outer electrodes 18, 20 are charged such that all of the electric fields emanating therefrom have the same polarity. The fields extend outwardly from inner and outer electrodes 18, 20. Field strength is greatest closer to electrodes 18, 20, and dissipates moving away from electrodes 18, 20. Preferably, the strength of the electric fields is substantially dissipated at a distance of about 25 mm from the exterior surface of panel 10 proximate the corresponding touch zone. Voltage input may be increased if stronger fields are desired.

Integrated control circuits 22 and the associated resistors R1, R2 are configured such that a predetermined potential difference or voltage is created by each electric field. The strengths of the electric fields generated about inner and outer electrodes 18, 20 are sensed and compared by integrated control circuit 22. When an object or stimulus, such as fingertip F, is proximate the corresponding touch zone Z, the electric fields associated with inner and outer electrodes 18, 20 are disturbed. (Preferably, the stimulus must be 25 mm or closer to the touch zone Z to disrupt the electric fields, given that the field strength preferably is substantially dissipated at greater distances.) Preferably, integrated control circuit 22 produces an output signal indicating a touch only when it senses that disturbance to the electric field about inner electrode 18 exceeds the disturbance to the electric field about outer electrode 20 by a predetermined degree. This output signal is sent to an associated controller (not shown), as discussed further below.

Typically, contaminants and debris would affect the electric fields about both inner and outer electrodes 18, 20 equally. Because at least the foregoing threshold difference in field disturbance must be sensed in order for integrated control circuit 22 to output a signal indicating a touch, unintended responses caused by contaminants are minimized. Similarly, unintended responses resulting from a user placing a finger or other stimulus proximate a touch zone Z such that the stimulus affects the electric field about outer electrode 20 to a greater degree than the electric field about inner electrode 18 are minimized.

Figure 7:
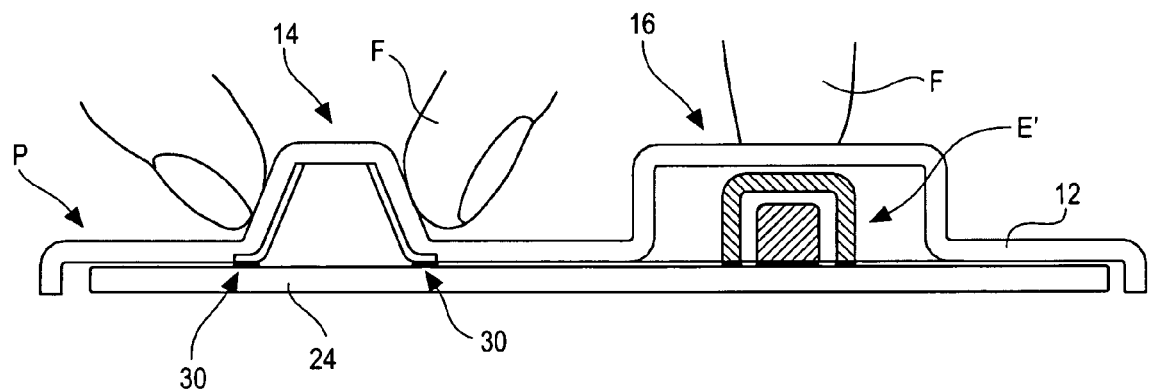
FIG. 7 is a cross-sectional view of a seat control panel according to another embodiment of the present invention.
Figure 8:
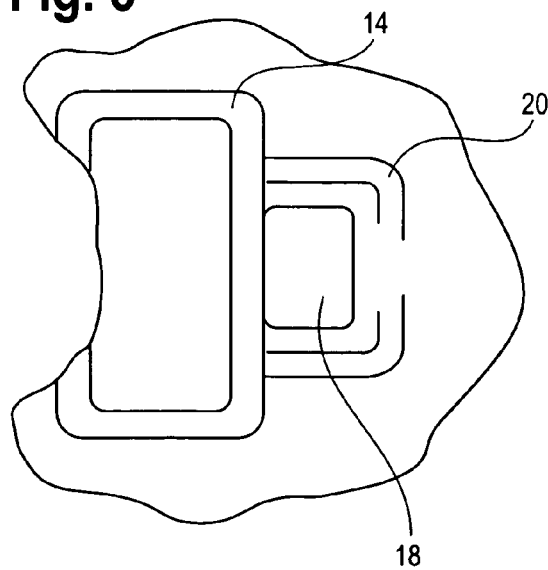
FIG. 8 is a bottom view of a molded portion and electrode pattern shown in FIG. 7.

In another embodiment, conductive electrodes E' are stamped electrodes that are insert molded directly into protruding portions 14, 16, as best shown in FIGS. 7 and 8. Electrode pattern E' includes inner and outer electrodes 18, 20 as described above. However, inner and outer electrodes 18, 20 of electrode pattern E' preferably are capacitively coupled to a printed circuit board 24 via capacitive plates 30, as described more fully in U.S. Provisional Patent Application No. 60/638,159. Board 24 may be inserted behind base portion 12 of panel 10, and capacitively coupled to the insert molded electrodes 18, 20. This technique simplifies manufacturing, thereby reducing cost. In addition, electrodes 18, 20 may be capacitively coupled through a relatively thick dielectric substrate, which would not otherwise allow an electric field of sufficient strength to emanate therethrough. Thus, design flexibility of the system is improved.

Each integrated control circuit 22 preferably is coupled to a controller (not shown), which may be disposed on panel 10 or elsewhere. The controller processes output signals it receives from each integrated control circuit 22 and, in turn, generates control signals which cause the seat to move forward, backward, up, down, etc.

As noted above, panel 10 may be formed directly in the bezel or molding of the seat or door panel. Base portion 12 may therefore be integral with a trim piece, portion of the seat, or arm rest on the door panel. In addition to controls for seat movement, base portion 12 may also include additional control sensors 100, as best shown in FIG. 1. Alternatively, a separate molded panel P may be formed, as best shown in FIG. 7, which is secured to the desired molding or trim of a vehicle. The panel P may include lock tabs, so that the system may be easily snapped or clamped in place during manufacture.

It will be understood to one of ordinary skill in the art that various modifications and configurations may be made to the present disclosure without departing from the scope or spirit of the present invention as defined by the appended claims. Further, aspects of one embodiment may be incorporated into another embodiment. The present invention is intended to include all such modifications and variations.

The invention claimed is:

1. An ergonomic seat control panel, comprising:
a substrate defining a base portion and a first protruding portion protruding from said base portion, said first protruding portion corresponding to a first movable portion of a seat and said first protruding portion defining a first touch surface in a first location corresponding to a first direction of movement of said first movable portion and a second touch surface in a second location corresponding to a second direction of movement of said first movable portion;
a first touch sensor comprising a first sensing electrode in the form of a thin conductive pad and an outer sensing electrode substantially surrounding said first sensing electrode, said first sensing electrode and said outer sensing electrode in operable association with said first touch surface; and
a second touch sensor comprising a second sensing electrode in operable association with said second touch surface;
wherein at least one of said first and second electrodes comprises a stamped electrode that is insert-molded into said corresponding protruding portion,
wherein introduction of a stimulus proximate said first touch surface causes movement of said first movable portion of said seat in said first direction, and
wherein introduction of a stimulus proximate said second touch surface causes movement of said first movable portion of said seat in said second direction.

2. The control panel of claim 1 wherein each of said first sensing electrode and said outer sensing electrode is coupled to an electrical signal source and receives an electrical signal from said electrical signal source;
wherein an electric field is generated about each of said first sensing electrode and said outer sensing electrode in response to said electrical signal;
wherein introduction of a stimulus proximate said first touch sensor causes movement of said first movable portion only if said stimulus disturbs said electric field about said first sensing electrode to a greater degree than said stimulus disturbs said electric field about said outer sensing electrode.

3. The control panel of claim 1 wherein said first protruding portion is integral with said base portion.

4. The control panel of claim 1 wherein said first protruding portion mimics the shape of said first movable portion.

5. The control panel of claim 4 wherein said second protruding portion mimics the shape of said second movable portion.

6. The control panel of claim 1 wherein said second protruding portion mimics the shape of said second movable portion.

7. The control panel of claim 6 wherein said first protruding portion mimics the shape of said first movable portion.

8. The control panel of claim 1 wherein said control panel is integral with said seat.

9. The control panel of claim 1 wherein said seat comprises a fabric and said control panel is incorporated into said fabric.

10. The control panel of claim 1 wherein said seat comprises seat trim and said control panel is integrally molded with said seat trim.

11. The control panel of claim 1 further comprising tactile means associated with at least one of said first through fourth touch surfaces.

12. The control panel of claim 11 wherein said tactile means comprises a depression.

13. The control panel of claim 11 wherein said tactile means comprises a bump.

14. The control panel of claim 11 wherein said tactile means comprises a bezel.

15. The control panel of claim 1 further comprising:
a second protruding portion protruding from said base portion, said second protruding portion corresponding to a second movable portion of said seat and said second protruding portion defining a third touch surface in a third location corresponding to a first direction of movement of said second movable portion and a fourth touch surface in a fourth location corresponding to a second direction of movement of said second movable portion;
a third touch sensor comprising a third sensing electrode, said third sensing electrode disposed on said substrate in operable association with said third touch surface; and
a fourth touch sensor comprising a fourth sensing electrode, said fourth sensing electrode disposed on said substrate in operable association with said fourth touch surface;
wherein introduction of a stimulus proximate said third touch surface causes movement of said second movable portion of said seat in said first direction, and
wherein introduction of a stimulus proximate said fourth touch surface causes movement of said second movable portion of said seat in said second direction.

16. The control panel of claim 15 wherein said base portion defines a fifth touch surface, said control panel further comprising a fifth touch sensor comprising a fifth sensing electrode, said fifth sensing electrode disposed on said substrate in operable association with said fifth touch surface, said fifth touch sensor corresponding to a controllable function of said seat.

17. The control panel of claim 1 further comprising a first capacitive plate capacitively coupled to said first sensing electrode.

18. An ergonomic seat control panel, comprising:
a substrate defining a base portion and a first protruding portion protruding from said base portion, said first protruding portion corresponding to a first movable portion of a seat and said first protruding portion defining a first touch surface in a first location corresponding to a first direction of movement of said first movable portion and a second touch surface in a second location corresponding to a second direction of movement of said first movable portion;
a first touch sensor comprising a first sensing electrode in operable association with said first touch surface;
a capacitive plate capacitively coupled to said first sensing electrode; and
a second touch sensor comprising a second sensing electrode in operable association with said second touch surface;

wherein at least one of said first and second electrodes comprises a stamped electrode that is insert-molded into said corresponding protruding portion, wherein introduction of a stimulus proximate said first touch surface causes movement of said first movable portion of said seat in said first direction, and wherein introduction of a stimulus proximate said second touch surface causes movement of said first movable portion of said seat in said second direction.

19. The control panel of claim 18, wherein said first sensing electrode comprises a thin conductive pad and wherein said first touch sensor further comprises an outer sensing electrode disposed on said substrate, said outer sensing electrode substantially surrounding said first sensing electrode.

20. The control panel of claim 19 wherein each of said first sensing electrode and said outer sensing electrode is coupled to an electrical signal source and receives an electrical signal from said electrical signal source;

wherein an electric field is generated about each of said first sensing electrode and said outer sensing electrode in response to said electrical signal;

wherein introduction of a stimulus proximate said first touch sensor causes movement of said first movable portion only if said stimulus disturbs said electric field about said first sensing electrode to a greater degree than said stimulus disturbs said electric field about said outer sensing electrode.

* * * * *